United States Patent [19]

Uchida

[11] 3,750,028

[45] July 31, 1973

[54] TUNING SYSTEM

[75] Inventor: Kosaku Uchida, Neyagawa, Japan

[73] Assignee: Matsushita Electric Industrial Co., Ltd., Osaka, Japan

[22] Filed: June 21, 1971

[21] Appl. No.: 154,980

[30] Foreign Application Priority Data

June 25, 1970 Japan ............................... 45/55682
June 25, 1970 Japan ............................... 45/55683

[52] U.S. Cl. ..................... 325/418, 325/464, 334/15
[51] Int. Cl. ........................... H03h 5/12, H03j 3/06
[58] Field of Search .................... 325/422, 452, 454, 325/459, 464, 465, 469; 334/15, 16

[56] References Cited

UNITED STATES PATENTS 3,487,311 12/1969 Luhowy .......................... 325/422 X
3,517,352 6/1970 Marshall et al. ...................... 334/15
3,505,620 4/1970 Miner ................................. 334/15

*Primary Examiner*—Benedict V. Safourek
*Attorney*—Stevens, Davis, Miller & Mosher

[57] ABSTRACT

A tuning system comprising a tuning circuit for selecting a channel, by the impedance of a variable capacitance diode, a power supply for generating a tuning voltage, and an AFT circuit for generating an AFT (automatic fine tuning) voltage. The power supply and the AFT circuit are connected in parallel with each other so that the tuning voltage and the AFT voltage are superimposed one on the other and applied to one of the terminals of the variable capacitance diode, while the other terminal of the variable capacitance diode may be grounded in order to check the increase in floating capacitance and tune in, to a wide range of frequencies.

4 Claims, 7 Drawing Figures

TUNING SYSTEM

The present invention relates to a tuning system in which a channel is selected by the impedance of a variable capacitance diode.

Generally, in a channel-selection system of a television receiver composed of a tuning circuit employing a variable capacitance diode (varactor diode), a tuning voltage is applied to one of the two terminals of the variable capacitance diode, while an AFT voltage (automatic fine tuning voltage) is applied to the other terminal thereof. However, since one of the terminals of the variable capacitance diode is separated from the ground in connection with a direct current, equivalent stray capacitance is increased, making it difficult to tune in to a wide range of frequencies. As a result, it is necessary that the tuning voltage and AFT voltage be both applied to only one of the terminals of the variable capacitance diode.

Description will be made with reference to the accompanying drawings in which.

Figures 6, 7:
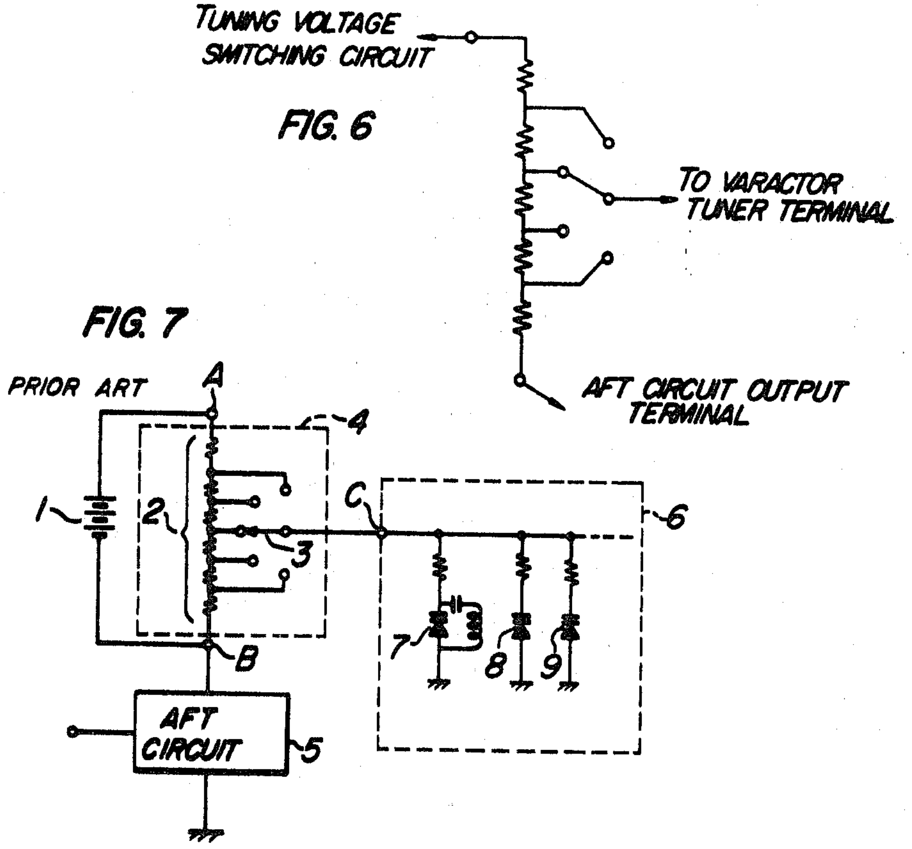
FIG. 6 is a circuit diagram showing the essential parts of the embodiment of FIG. 5 as they are changed.
FIG. 7 is a circuit diagram showing a conventional tuning system.

In a conventional tuning system for a television receiver, as shown in FIG. 7, the voltage from the stabilized tuning voltage source 1 is applied between the input terminals A and B of a tuning voltage switching circuit comprising a plurality of resistors 2 and a tuning switch 3, which is operated, for channel selection, in such a manner that a voltage corresponding to a predetermined channel is applied to the tuning voltage input terminal of a tuning circuit 6 comprising variable capacitance diodes 7 to 9. On the other hand, the output of an AFT circuit 5 which has received a video intermediate frequency carrier is applied to the input terminal B, wherefrom it is applied through the tuning voltage switching circuit 4 to the tuning voltage input terminal C of the tuning circuit 6 to perform AFT operation. This method, however, involves the stabilized voltage source 1 separated from the ground, so that it is necessary to design a voltage source using an insulating transformer, resulting in high manufacturing cost.

The present invention is aimed at obviating the above-mentioned disadvantages, and an object of the invention is to provide a tuning system in which the tuning voltage and the AFT voltage are both applied only to one terminal of a variable capacitance diode in order to check the increase in stray capacitance, whereby tuning to a wide range of frequencies is made possible.

Another object of the present invention is to provide a tuning system wherein, in applying to a variable capacitance diode, a voltage obtained by superimposing a tuning voltage and an AFT voltage one on the other, the tuning voltage source or AFT circuit need not be separated from the ground, making it possible to design the system easily and manufacture it at low cost.

Still another object of the present invention is to provide a tuning system which is capable of supplying a sufficient amount of tuning voltage to the variable capacitance diode even when the voltage generated by the tuning voltage source is low.

Still another object of the present invention is to provide a tuning system which automatically maintains a certain AFT sensitivity for each channel selected.

The above and other objects, features and advantages will be made apparent by the detailed description regarding embodiments according to the present invention.

Figure 1:
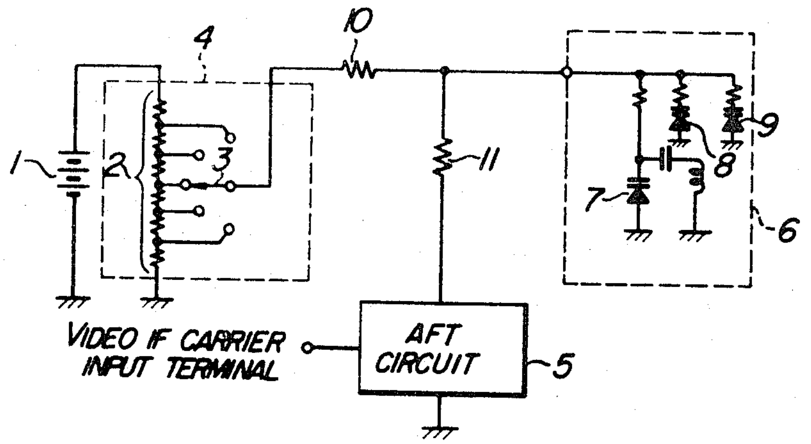
FIG. 1 is a circuit diagram showing the tuning system according to an embodiment of the present invention.

Referring to FIG. 1, the reference numerals 1 to 6 show elements which have the same names and operate the same way as those marked with the same numerals in FIG. 7. Numeral 10 shows a resistor inserted between the output terminal of the tuning voltage switching circuit 4 and the tuning voltage input terminal of the tuning circuit 6. Numeral 11 shows a resistor inserted between the output terminal of the AFT circuit 5 and the tuning voltage input terminal of the tuning circuit 6.

Explanation will be made now of the operation of the above-described embodiment. The voltage $E_1$ of the stabilized tuning voltage source 1 is applied to the tuning voltage switching circuit 4 comprising the resistors 2 and the tuning switch 3 thereby generating a voltage corresponding to a channel to be selected. This voltage is applied to the tuning circuit 6 through the resistor 10. The output voltage of the AFT circuit 5 is also applied to the tuning circuit 6 through the resistor 11, whereupon, inside the tuning circuit 6, the voltage applied to the tuning voltage input terminal is also applied further to a plurality of variable capacitance diodes 7 to 9. As a result, the variable capacitance diodes 7 to 9 are set at a predetermined value of capacitance and thereby the tuning circuit 6 is set in such a condition as to be tuned in to a corresponding channel.

Figure 2:
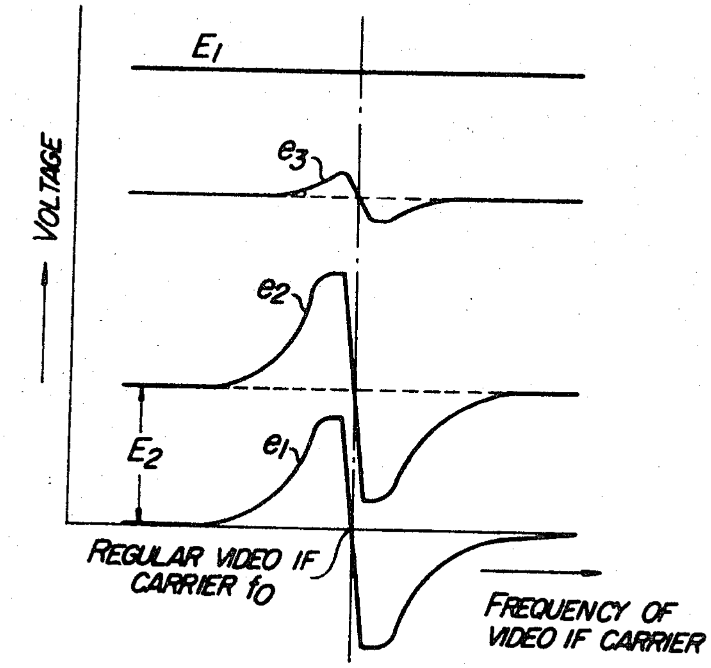
FIG. 2 is a diagram showing the characteristics of output voltages of the essential parts of the tuning system according to the present invention.

The above-described operations will be described more in detail with reference to FIG. 2. The character $E_1$ in the drawing shows the level of a voltage generated by the tuning voltage source 1, and a voltage equivalent to the voltage $E_1$ multiplied by the coefficient $\alpha$ determined by the voltage division ratio of the resistors 2 included in the tuning voltage switching circuit 4 and that of the resistors 10 and 11 is applied to the tuning circuit 6. Also, when a video intermediate frequency carrier wave is applied to the video IF carrier input terminal of the AFT circuit 5, a frequency discriminator in the AFT circuit 5 produces an output as shown by $e_1$ of FIG. 2 which has both positive and negative values. The AFT circuit 5 produces an output voltage $e_2$ which is equivalent to the sum of the voltage $e_1$ and the unchanged voltage portion $E_2$ generated at the time of DC amplification of the voltage $e_1$. A voltage equivalent to the voltage $e_2$ multiplied by the coefficient $\beta$ determined by a circuit comprising the resistors 10 and 11 is applied to the tuning circuit 6. In other words, the voltage $e_3 = \alpha E_1 + \beta e_2$ which is the sum of the output of the tuning voltage switching circuit 4 and that of the AFT circuit 5 is applied to the tuning circuit 6.

It will be understood from the foregoing description that no problem is offered by combining the output voltage of the AFT circuit 5 with a DC voltage. In addition, there is a relatively broader allowance for the value of the output impedance of the AFT circuit 5, thereby facilitating the designing of the AFT circuit 5.

If the resistance value of the resistor 10 >> than the resistance value of the resistor 11, the voltage $e_3$ applied to the tuning circuit 6 need not be reduced to a level much lower than the voltage $E_1$ and accordingly there is no need to raise the voltage $E_1$ of the tuning voltage source 1 to a high level. In this case, the AFT voltage contributes less to the input voltage to the tuning curcuit 6, but this presents no problem since the AFT voltage required in a tuning circuit with a variable capacitance diode is generally sufficiently small.

Further, in place of the combination of the resistors 2 of the tuning voltage switching circuit 4 and the tuning switch 3, a single variable resistor may be used. Also, by combining the tuning switch 3 with a plurality of variable resistors instead of the resistors 2, it is possible to preset the system.

As can be seen from above, according to the embodiment of FIG. 1, each of the tuning voltage source $E_1$ and the AFT circuit 5 has one of its terminals capable of being grounded, thereby simplifying the construction thereof. Also, a low voltage of the tuning voltage source $E_1$ suffices, and the need for reducing the output impedance of the AFT circuit 5 is eliminated. In this embodiment, however, the AFT sensitivity varies in accordance with the channel switching operation. That is to say, in a turn of a television receiver employing a variable capacitance diode, the relation between the bias voltage applied to the variable capacitance diode and the frequencies (channels) capable of being received is non-linear as shown by curve a of the FIG. 4, the gradient of the curve depending on the bias voltage (tuning voltage). Further, the maximum variation in the output voltage of the AFT circuit due to the frequency change is almost constant in the practicable range of the strength of the electric field. When this constant AFT voltage or its division by a predetermined rate is directly applied to the variable capacitance diode, it may cause an over-pulling effect by the AFT voltage such that a neighbouring channel is erroneously pulled or there is an insufficient pulling effect, depending on the channel to be received.

Figure 3:
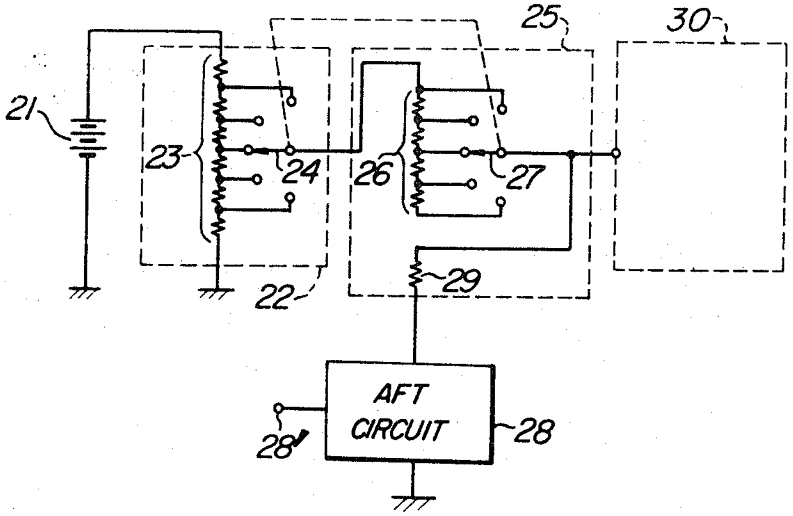
FIG. 3 is a circuit diagram showing another embodiment of the present invention.

The system shown in FIG. 3 is aimed at obviating the above-mentioned disadvantages. In the figure, the reference numeral 21 shows a tuning voltage source for generating a DC voltage to be applied to a tuning voltage switching circuit 22, and numerals 23 and 24 a resistor group and a tuning switch for selectively connecting a resistor in the resistor group, respectively, the resistor group 23 and tuning switch 24 making up the tuning voltage switching circuit 22. Numeral 25 shows an AFT sensitivity switching circuit to which the output of the tuning voltage switching circuit 22 is applied and which comprises the resistor group 26 and the sensitivity changeover switch 27. Numeral 28 shows an AFT circuit to the input terminal 28′ of which a video intermediate frequency carrier wave is applied, and which applies its output to the output terminal of the sensitivity change-over switch 27 through the resistor 29. Numeral 30 shows a tuning circuit to which the output of the AFT sensitivity switching circuit 25 is applied and which contains a variable capacitance diode. The tuning switch 24 is operatively interlocked with the sensitivity change-over switch 27.

In the embodiment with the above-described construction, a voltage of the tuning voltage source 21 is applied to the tuning voltage switching circuit 22 and one of the switches 23 is selected by the tuning switch 24, whereby a voltage corresponding to a channel to be selected is applied to the AFT sensitivity switching circuit 25. This voltage is then applied to the resistor group 26, and an output obtained as the result of selecting a resistor out of the group 26 by means of the sensitivity change-over switch 27 interlocked with the tuning switch 24 is applied to the tuning circuit 30. On the other hand, the output of the AFT circuit 28 is superimposed on the voltage of the tuning voltage source 21 at the output terminal of the sensitivity change-over switch 27 through the resistor 29. In this case, a voltage obtained by dividing the output voltage of the AFT circuit 28 by the resistor 29 and the resistor group 26 is applied to the tuning circuit 30. In other words, the voltage applied to the tuning circuit 30 from the AFT circuit 28 varies according to the operation of the sensitivity change-over switch 27. Accordingly, it is possible to regulate both the AFT sensitivity and the tuning voltage across the tuning voltage switching circuit 22 by the operation of the tuning switch 24 interlocked with the sensitivity change-over switch 27.

Figure 4:
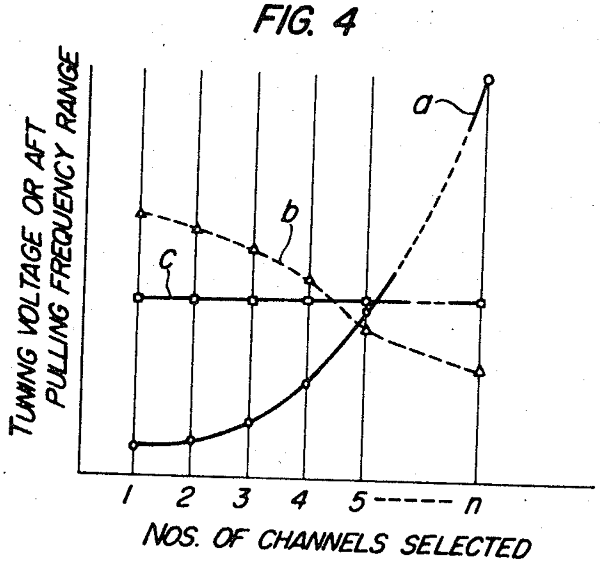
FIG. 4 is a diagram showing the characteristics of the tuning system according to the embodiment of FIG. 3.

The curve b of FIG. 4 shows the range of pulling frequencies for AFT when the tuning operation is performed by operating only the tuning switch 24 without interlocking it with the sensitivity change-over switch 27. From this curve, it will be apparent that the range of pulling frequencies for AFT is different from the case of curve C where the above-mentioned two switches 24 and 27 are interlocked with each other.

Each resistor constituting the resistor group 23 may be replaced by a variable resistor so that a presetting or fine adjustment is accomplished for each channel.

Figure 5:
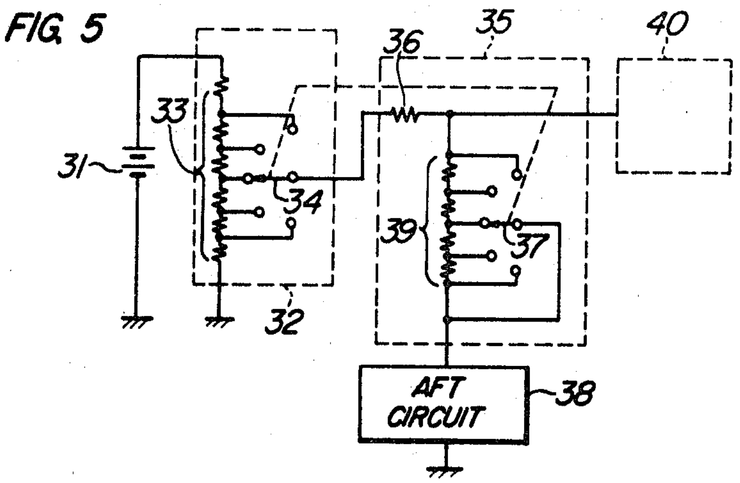
FIG. 5 is a circuit diagram showing still another embodiment of the present invention.

The circuit shown in FIG. 5 is a modification of the one shown in FIG. 3, and the reference numerals 31 to 40 in FIG. 5 correspond to the numerals 21 to 30 respectively in FIG. 3. The modification includes the fixed resistors 36 and 29 in place of the resistor group 26 and 39 respectively, while the change-over switch 37 is operated in accordance with the operation of of the tuning voltage. As a result, it is possible to damper the variations in AFT sensitivity with channels.

What is claimed is:

1. Apparatus for maintaining the sensitivity of a multi-frequency tuning circuit uniform over a wide range of received frequencies, comprising:

a voltage source;

a tuning voltage selecting circuit coupled to said voltage source for selecting a tuning voltage corresponding to a desired channel frequency;

an automatic fine tuning circuit for providing a corresponding fine tuning voltage;

a main tuning circuit, including at least one variable capacitance diode, said main tuning circuit being tuned to said desired channel frequency in correspondence with the impedance of said variable capacitance diode;

a first resistance circuit coupled to the output of said tuning voltage selecting circuit;

a second resistance circuit coupled to the output of said automatic fine tuning circuit;

said first and second resistance circuits being coupled to each other at their respective outputs so that the output of each resistance circuit is superimposed onto that of the other, the coupled outputs of said first and second resistance circuits being coupled to the input of said main tuning circuit; and means for adjusting the ratio of the composite impedance of said tuning voltage selecting circuit and said first resistance circuit to the composite impedance of said automatic fine tuning circuit and said second resistance circuit to thereby maintain the sensitivity of said tuning circuit uniform over a predetermined range of desired channel frequencies.

2. The apparatus according to claim 1, wherein said second resistance circuit has a resistance value higher than that of said first resistance circuit.

3. The apparatus according to claim 1, wherein one of said first and second resistance circuits comprises one fixed resistor, the other comprising variable resistance means, the resistance value of said variable resistance means being varied in response to the operation of said tuning voltage selecting circuit, whereby the ratio of the superimposed automatic fine tuning voltage applied to one terminal of said variable capacitance diode is changed and the sensitivity is made uniform.

4. Apparatus for maintaining the sensitivity of a multi-frequency television receiver tuning circuit uniform over a wide range of received frequencies, comprising:

a voltage source;

a tuning voltage selecting circuit including voltage dividing resistance means coupled to said voltage source for selecting a tuning voltage corresponding to a desired channel frequency;

an automatic fine tuning circuit for providing a corresponding fine tuning voltage, said automatic fine tuning circuit including means for frequency discriminating video intermediate frequency carriers of the received television signal;

a main tuning circuit, including at least one variable capacitance diode, said main tuning circuit being tuned to said desired channel frequency in correspondence with the impedance of said variable capacitance diode;

a first resistance circuit coupled to the output of said tuning voltage selecting circuit;

a second resistance circuit coupled to the output of said automatic fine tuning circuit;

said first and second resistance circuits being coupled to each other at their respective outputs so that the output of each resistance circuit is superimposed onto that of the other, the coupled outputs of said first and second resistance circuits being coupled to the input of said main tuning circuits; and means for adjusting the ratio of the composite impedance of said tuning voltage selecting circuit and said first resistance circuit to the composite impedance of said automatic fine tuning circuit and said second resistance circuit to thereby maintain the sensitivity of said tuning circuit uniform over a predetermined range of desired channel frequencies.

* * * * *